United States Patent [19]

Hedges

[11] 4,047,226
[45] Sept. 6, 1977

[54] TELEVISION SIGNAL-SEEKING AUTOMATIC TUNING SYSTEM

[75] Inventor: Rhey Warren Hedges, Miami, Fla.

[73] Assignee: Louis W. Parker, Fort Lauderdale, Fla.

[21] Appl. No.: 716,862

[22] Filed: Aug. 23, 1976

Related U.S. Application Data

[63] Continuation-in-part of Ser. No. 627,318, Oct. 30, 1975, abandoned.

[51] Int. Cl.² .......................... H04N 5/44; H04N 3/24
[52] U.S. Cl. ..................................... 358/193; 358/165
[58] Field of Search ................ 358/193, 165; 325/470; 334/18, 20, 21

[56] References Cited

U.S. PATENT DOCUMENTS 3,130,264   4/1964   Dietz ..................................... 358/193

Primary Examiner—John C. Martin
Attorney, Agent, or Firm—Pollock, Vande Sande & Priddy

[57] ABSTRACT

An intercarrier television receiver is provided with a motor-driven signal seeker coupled to the tuner of the receiver and operative to continuously tune the receiver until stopped by a control signal. The control signal is generated by monitoring and comparing the amplitudes of the picture subcarrier and sound subcarrier signals produced by the IF circuits of the receiver, and by using said comparison to generate a control signal only when the amplitude of the picture subcarrier signal is higher than the amplitude of the sound subcarrier signal by a predetermined ratio. Generation of the control signal interrupts the operation of the signal-seeker at points of correct tuning in a predetermined television frequency spectrum. Provision is also made to mute the picture- and sound-producing channels of the receiver until the signal seeker has tuned the receiver to a point of correct signal reception.

15 Claims, 4 Drawing Figures

TELEVISION SIGNAL-SEEKING AUTOMATIC TUNING SYSTEM

CROSS REFERENCE TO RELATED APPLICATION

This is a continuation-in-part of my prior application Ser. No. 627,318, filed Oct. 30, 1975 now abandoned.

BACKGROUND OF THE INVENTION

The present invention is concerned with signal-seeking tuning systems for use in television receivers, and is more particularly concerned with a system for identifying a television signal and providing a control signal to a motor-tuned station selector in an intercarrier television receiver for selectively interrupting the operation of a signal-seeker at points of correct tuning in a predetermined television frequency spectrum.

Signal-seeking tuning systems for use in television receivers have been suggested heretofore. Such systems commonly employ a motor-driven signal seeker which is connected to the tuner of a television receiver, and which is energized to commence a continuous variation in the tuning of said receiver over a predetermined television frequency spectrum in response to momentary actuation of a start switch forming a portion of the system. The signal seeker continues its tuning operation until a point of correct frequency reception has been achieved, corresponding to the frequency of the transmitted television signal in the area of reception having a signal level sufficiently high to be properly reproduced by the receiver, at which time the receiver generates a control signal which functions to de-energize the motor-driven signal seeker to stop tuning of the receiver. The same type of general operation may be achieved, moreover, by using voltage-controlled tuners employing varactor diodes, with a progressively-variable voltage generator being used instead of a scanning motor. All such known systems constitute "signal seekers" within the meaning of the term as employed herein.

During a continuous tuning operation of the type described above, points of tuning will be achieved where a control signal, operative to stop the signal seeker, will be generated by image frequency heterodyning rather than by the reception of proper signal transmissions. The art has recognized this problem and efforts have been made to devise circuits which will distinguish between correct control signals resulting from the reception of a proper television transmission, and incorrect control signals which have resulted from image frequency heterodyning. The theories upon which these prior circuits have been based vary, with the result that the circuits have achieved image frequency rejection with varying degrees of reliability. As a general matter, however, prior art circuits have become increasingly reliable to achieve image frequency rejection only at the expense of increasingly complex and costly circuit configurations.

The present invention is intended to obviate these problems in the prior art by the provision of a signal identifier, for use in a signal-seeking tuning system, which is far simpler than signal identification circuits suggested heretofore, but which nevertheless achieves completely reliable operation and rejection of improper control signals resulting from image frequency heterodyning.

SUMMARY OF THE INVENTION

In accordance with the present invention, an improved signal identification circuit is provided which achieves, in a highly simplified but completely reliable fashion, four main functions, i.e., it identifies the television signal among various other signals; it provides a control signal to a signal seeker such as a motor-driven station selector in a television receiver operative to interrupt operation of the signal seeker when a point of correct tuning of the identified signal has been achieved; it disables or mutes the audio and video portions of the receiver over the entire tuning band except at points of correct tuning; and it eliminates spurious control signals at points during the tuning operation where image frequencies would normally appear. In achieving the muting operation, the present invention makes use of principles and circuits described in Parker U.S. Pat. No. 3,686,430 issued Aug. 22, 1972, for "Muter for Solid State Television Receivers," the disclosure of which is incorporated herein by reference. The signal identifying, control signal generation, and image frequency rejection features of the invention rely, however, upon certain characteristics of standard television transmissions which have not been employed, heretofore, to accomplish these specific functions.

More particularly, the regulations of the Federal Communications Commission specify that the picture and sound signals in a given television transmission must exhibit substantially equal coverage or reception range. To accomplish this in a compatible color transmission, the regulations state that the effective radiated power of the aural or sound transmitter must be not less than 10% nor more than 20% of the peak radiated power of the visual or picture transmitter. In the United States, it is standard practice for television stations to adopt the lower limit (10%) of these ranges in the interest of economy, particularly since the quality of the sound coverage, even at this level of transmitted power, still exceeds the quality of the available picture information. Similar transmission standard regulations (which may, however, specify different power ratios) exist in other countries.

These enforced transmission standards guarantee that a specific amplitude ratio difference between the picture and sound subcarrier signals will be produced by conventional heterodyning action in a television receiver when the receiver has been properly tuned to receive a television station within its area of reception. The present invention, by monitoring the amplitudes of the picture subcarrier and sound subcarrier signals, to assure that each has a level above the minimum required to achieve adequate sound and picture reproduction, and by further monitoring the comparative amplitudes of the picture subcarrier and sound subcarrier signals to determine when they exhibit an appropriate amplitude ratio corresponding to the transmission standard which prevails in the region of reception, thus operates to identify a television signal among various other types of signals and provides an appropriate control signal, when a point of correct tuning of the identified signal has been achieved, which operates to interrupt a signal-seeker associated with the television receiver.

The foregoing principles are employed, moreover, to assure that the signal seeker is not interrupted at points in the frequency spectrum where image frequencies appear. When a superheterodyne receiver is tuned to the image of a television signal, the picture transmission produces a video signal at the sound subcarrier frequency, while the sound transmission produces an audio signal at the picture subcarrier frequency. Because the subcarrier signal amplitudes are a function of actual transmitted power, the amplitude ratio of the image produced subcarrier signals is the reverse of that which is produced when the receiver is correctly tuned to a proper television transmission. If such a reversal in amplitude ratio should occur, the control signal is not generated and the signal seeker continues to operate without interruption.

BRIEF DESCRIPTION OF THE DRAWINGS

The foregoing objects, advantages, construction and operation of the present invention will become more readily apparent from the following description and accompanying drawings in which.

DESCRIPTION OF THE PREFERRED EMBODIMENT

Figure 1:
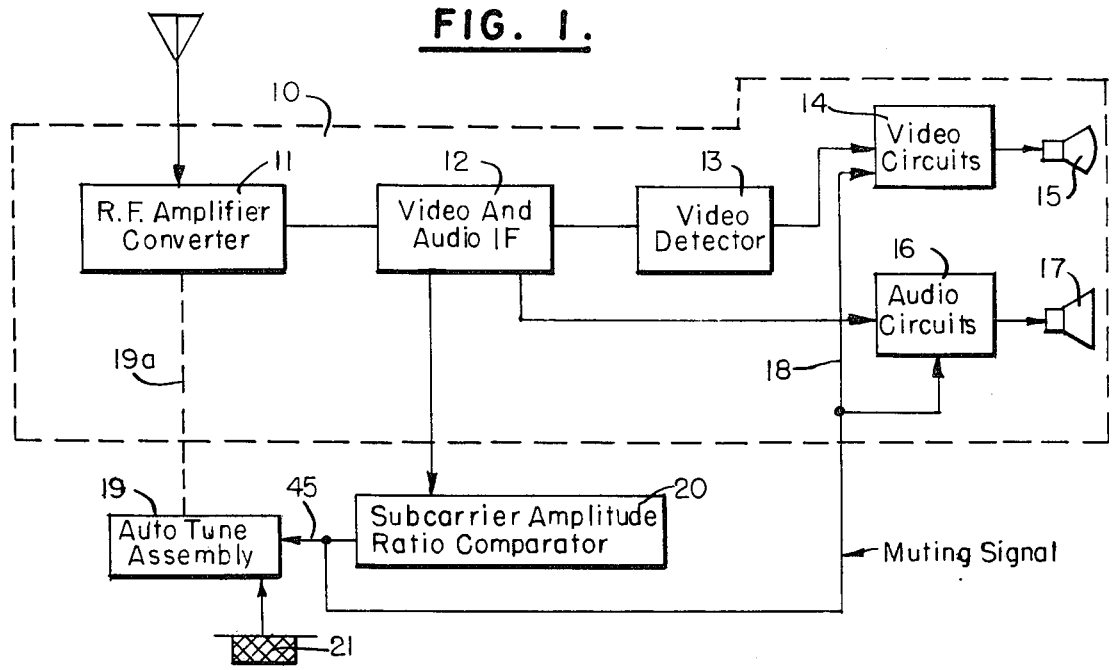
FIG. 1 is a circuit diagram of a signal identifier and associated television receiver circuit constructed in accordance with the present invention.

Referring initially to FIG. 1, various conventional portions of an intercarrier television receiver have been segregated by broken line 10. These parts of the receiver include a television tuner 11 which includes an RF amplifier and frequency converter stage, video and audio IF stages 12, a video detector 13 coupling the video signal to video circuits 14 which in turn control picture tube 15, and audio circuits 16 which are coupled to speaker 17. These portions of the receiver are conventional. Video circuits 14 and audio circuits 16 are preferably constructed in accordance with the disclosure of the aforementioned Parker patent and operate to mute or disable picture tube 15 and speaker 17 in response to a muting signal which may be supplied thereto via line 18.

In accordance with the improvement of the present invention, the outputs of the IF stages 12 are also coupled to a subcarrier amplitude ratio comparator 20, the output of which is in turn coupled to an automatic tuning assembly or signal seeker 19. The tuning assembly 19 is arranged to commence a tuning operation by momentary depression of a manual start button 21, and its output is mechanically coupled, as at 19a to the television tuner of the receiver to cause the receiver to continuously tune across a predetermined television frequency spectrum until a control signal, indicative of a point of correct tuning, is coupled from circuit 20 to the signal seeker 19 to interrupt its operation. The control signal so generated may be coupled, moreover, to the controllable video and audio circuits 14, 6, via line 18, to terminate the muting or disabling operation in the video and audio channels of the receiver described above.

The subcarrier amplitude ratio comparator 20 and its associated auto tune assembly 19 operate in accordance with the principles described earlier, i.e., circuit 20 monitors the absolute amplitude and amplitude ratio of the picture subcarrier and sound subcarrier signals produced by video circuits 12, and generates a control signal to interrupt the signal seeking operation and terminate the muting operation of the receiver only when the monitored amplitudes and their ratio correspond to a point of correct tuning. A preferred circuit operating in this fashion is illustrated in FIG. 2.

Figure 2:
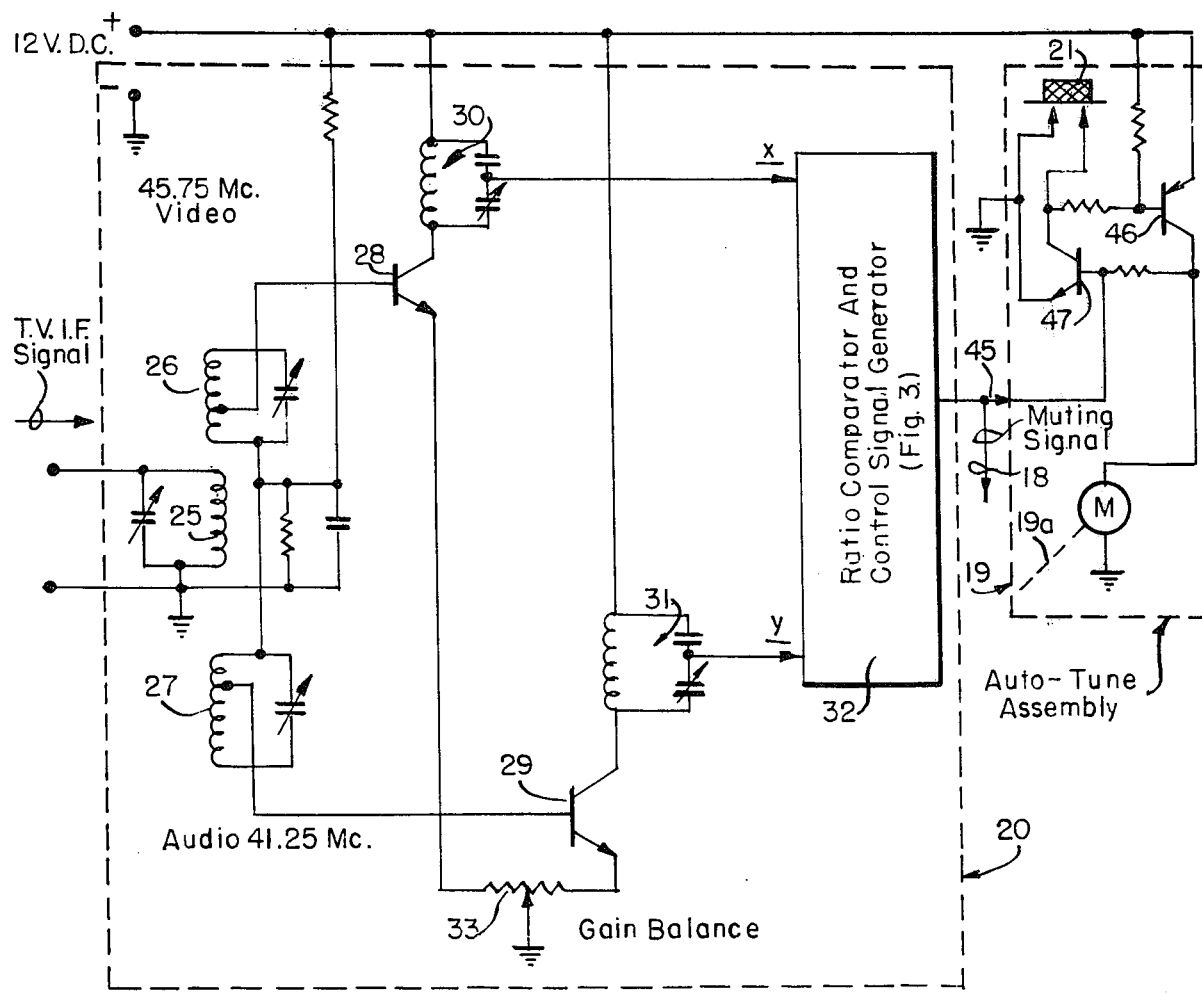
FIG. 2 is a circuit diagram of a portion of the circuit shown in FIG. 1.

Referring to FIG. 2, the IF signal generated by receiver stages 12 is coupled to a transformer having a primary winding 25 and two secondary windings 26, 27. Transformer primary 25 is tuned by an associate capacitor to a frequency of 43 MC, and the secondary windings 26, 27 are in turn tuned by associated capacitors to frequencies of 45.75 MC (the video subcarrier frequency) and 41.25 MC (the sound subcarrier frequency). The video subcarrier frequency signal is coupled from tuned secondary 26 to a transistor amplifier 28 while the sound subcarrier frequency signal is coupled to a similar transistor amplifier 29, and additional selectivity is obtained by providing tuned circuits 30 and 31 in the outputs of amplifiers 28, 29 which are tuned respectively to the video subcarrier and sound subcarrier frequencies. The signals produced across tuned circuits 30 and 31 are coupled respectively to inputs x and y of a ratio comparator and control signal generator circuit 32 which can take the form shown in FIGS. 3 or 4 to be described hereinafter.

The outputs of tuned circuits 30 and 31, assuming equal gain in the two signal paths which include amplifiers 28 and 29 respectively, have the same amplitude ratio as the input signals occurring at the video subcarrier and sound subcarrier frequencies respectively, but are at an amplified level. Since circuit 32 is intended to be responsive to the average amplitude ratio between said input signals, it is preferable that means be provided to assure that the two signal paths exhibit equal gain. This is accomplished by a gain balance potentiometer 33 which is connected between the emitters of the two transistor amplifiers 28, 29 as shown, with adjustment of the slider in said potentiometer being operative to adjust the two signal paths for equal gain.

Figure 3:
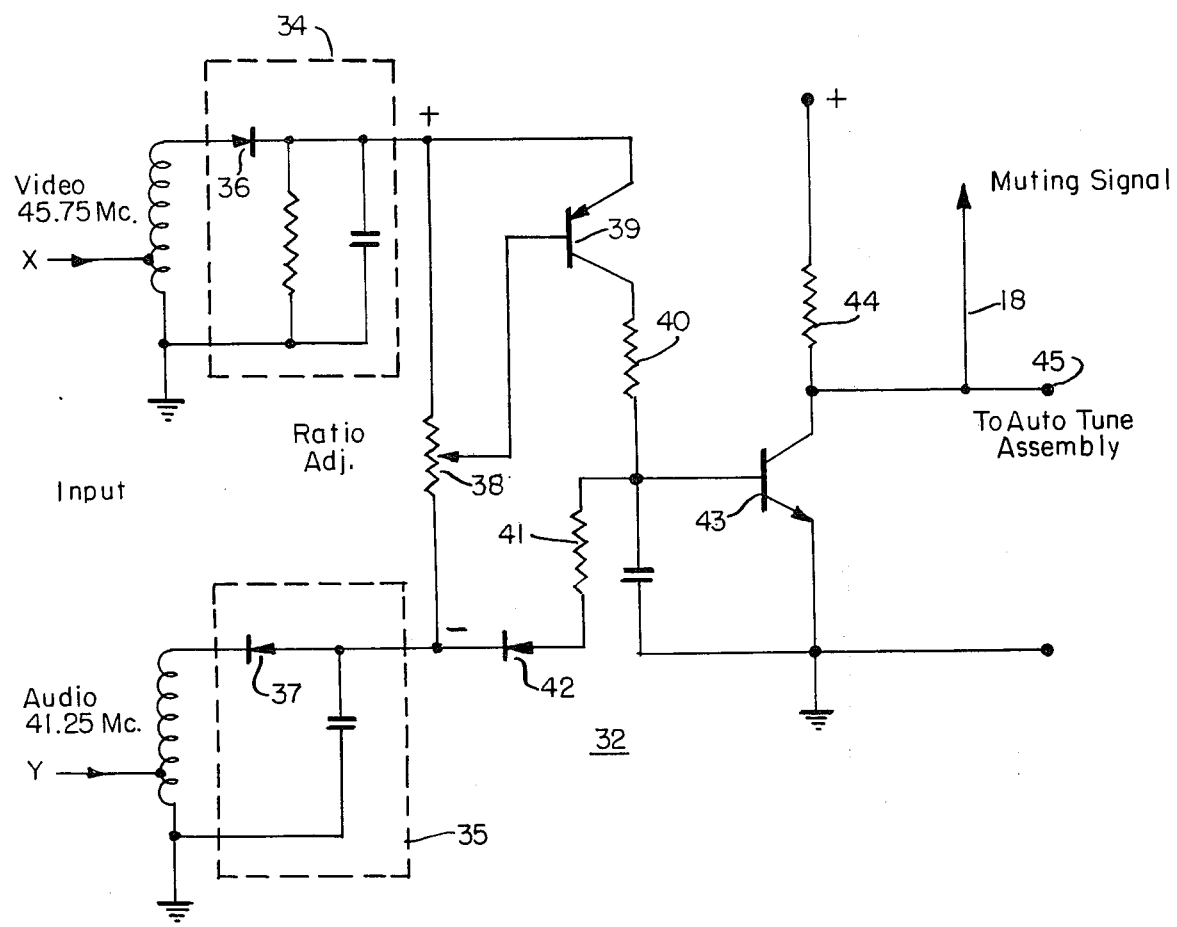
FIG. 3 is a circuit diagram of one form of ratio comparator and control signal generator which may be employed in the circuit of FIG. 2.

Referring now to FIG. 3, circuit 32 comprises a pair of input circuits 34, 35 which include oppositely poled detector diodes 36, 37 respectively, a ratio adjustment potentiometer 38 which is connected between input circuits 34, 35, a ratio comparator transistor 39 having its emitter connected to input circuit 34, its base connected to the slider on potentiometer 38, and its collector connected via a pair of resistors 40, 41 and a blocking diode 42 to input circuit 35, and an output switch transistor 43 which has its base connected to the junction of resistors 40, 41, its emitter connected to ground, and its collector connected via a resistor 44 to a source of positive potential. As will be discussed hereinafter, transistor 43 is normally nonconductive, but when it is driven into conduction it operates to lower the potential at the collector of transistor 43 thereby to generate a control signal at said collector which appears on line 18 for control of auto tune assembly 19 as well as for control of the muting circuits in receiver 10.

Considering the operation of the circuit shown in FIG. 3, the slider on ratio adjustment potentiometer 38 is so positioned that transistor 39 wil not conduct until the negative polarity, substantially DC output signal from detector diode 37 is at least one fourth as much as the positive polarity signal output from detector diode 36. Since the response of the circuit is comparatively broad, this particular adjustment of potentiometer 38 causes the circuit to operate properly under the aforementioned transmission standards in the United States, but the potentiometer may be varied to adjust the ratio so that the circuit operates properly in accordance with different transmission standards prevailing in other countries. Transistor 39 is of the PNP type, and is rendered conductive when its emitter is about 0.6 volts positive to its base; and this consideration, by appropriate selection of the gain provided by transistor amplifiers 28, 29, is used to assure that transistor 39 remains nonconductive unless the levels of the subcarrier signals produced by IF stages 12 are above the minimum required for adequate sound and picture production in the television receiver. As the signal seeker operates, therefore, comparatively weak television transmissions in the area of reception will not operate to produce subcarriers having a level sufficient to render transistor 39 conductive, transistor 39 will remain cut off, no control signal will be generated, and the signal seeker will continue to tune while the receiver video and audio circuits remain muted or disabled.

As the tuning operation continues automatically, when a transmitted signal is received wherein both subcarriers are above the minimum input level required for adequate sound and picture production, and the video subcarrier is stronger than the audio subcarrier by a ratio of at least 4:1, the negative voltage produced by diode detector 37 will be of sufficient magnitude to forward bias transistor 39, and transistor 39 will be driven into conduction. Conduction of transistor 39 will in turn couple the positive substantially DC voltage output of diode detector 36 via resistor 40 to the base of transistor 43. At the same time, the negative voltage produced by diode detector 37 will be coupled via diode 42 and resistor 41 to the base of transistor 43, but since the positive voltage coupled to transistor 43 has a level higher than that of the negative voltage coupled thereto, transistor 43 will be biased in its forward direction and will start to conduct. The conduction of transistor 43 via resistor 44 lowers the voltage at output 45 thereby stopping the auto tune assembly 19 at this point of correct tuning, it being assumed in this respect that assembly 19 is operative to continue its signal seeking operation only when the voltage at point 45 is above a predetermined level.

In the event that, during the tuning operation, an image frequency should be received, the amplitude ratio of the subcarriers will be reversed, and the comparative output levels of detectors 36 and 37 will similarly be reversed. The potentials produced at the various electrodes of transistor 39 under this condition of operation will still drive transistor 39 into conduction, but the positive signal coupled from detector 36 via transistor 39 and resistor 40 to the base of transistor 43 will have a level significantly less than that of the negative potential which is coupled from detector 37 via diode 42 and resistor 41. The resultant negative potential on the base of NPN transistor 43 accordingly prevents transistor 43 from conducting, with the result that the voltage at output 45 remains comparatively high and the signal seeking operation is not interrupted By reason of the foregoing operation, the circuit shown in FIG. 3 automatically identifies a proper television signal, and operates to reject image signals. Moreover, a spurious (or noise) signal appearing across either input circuit 34 or input circuit 35 at the video subcarrier or sound subcarrier frequency cannot forward bias both of transistors 39 and 43, regardless of its amplitude, and such a spurious signal is therefore incapable of interrupting the signal seeking operation. Further, the signal seeker will not stop when the receiver encounters a television signal which is too weak for adequate sound and picture reproduction because, as described earlier, the subcarrier amplitude ratio comparator 32 is incapable of generating the required control signal at output point 45 when the video and sound subcarrier signals are below a minimum threshold, even when their comparative amplitude ratio is correct. In short, the circuit of FIG. 3 operates to generate a control signal only when both subcarrier signals are simultaneously present and exhibit levels in excess of the minimum required for proper reproduction, and further exhibit the required amplitude ratio as determined by the setting of potentiometer 38.

The output signal at terminal 45 may, as described earlier, also be coupled via line 18 for use in controlling a muting or disabling operation of video and audio circuits 14, 16 in receiver 10. This aspect of the invention is described in the aforementioned Parker U.S. Pat. No. 3,686,430, and the control signal which is selectively generated by the circuits of FIGS. 2 and 3 described above can be employed in place of the control signal generating circuits illustrated in said Parker patent.

The control signal which is selectively produced at output point 45 may be used in any of a variety of manners to interrupt the automatic tuning operation. For example, assembly 19 may include an electromechanical relay the energization state of which is responsive to the voltage level at point 45 so that when the voltage is reduced the switching state of the relay is altered to terminate the signal seeking operation. An alternative arrangement, having the advantage that it eliminates the use of mechanical moving parts, is shown in FIG. 2. When the form of assembly 19 shown therein is employed, output point 45 of circuit 32 is connected directly to auto tune assembly 19 in the fashion illustrated, and resistor 44 (FIG. 3) is eliminated.

The automatic tuning assembly 19 shown in FIG. 2 comprises a drive motor M which is connected between ground and a source of positive potential via a motor drive transistor 46. The base of transistor 46 is in tune connected to the collector of a latch transistor 47, the emitter of which is connected to ground as illustrated; and the base of transistor 46 as well as the collector of transistor 47 are adapted to be selectively connected to ground by depression of push button 21 to bridge a pair of contact points associated therewith as shown in FIG. 2. The operation is as follows:

Transistor 46 is normally nonconductive, and motor M is therefore normally de-energized. When start button 21 is momentarily depressed, the base of transistor 46 is grounded and transistor 46 is biased in its forward direction. Transistor 46 is accordingly rendered conductive to energize motor M. The conduction of transistor 46 also operates to forward bias latch transistor 47, whereby transistor 47 is rendered conductive and operates to keep transistor 46 in its conductive state when the push button 21 returns to its normally open condition.

The circuit is "unlatched" when a control signal appears at terminal 45, i.e., when the potential level at terminal 45 drops in response to a forward bias of proper polarity and amplitude at the base electrode of transistor 43 (see FIG. 3). When such a control signal is generated, the forward bias supplied via transistor 47 to the base of transistor 46 is conducted to the common ground bus terminating conduction of latch transistor 47 and removing the forward bias supplied to motor drive transistor 46. Transistor 46 is accordingly rendered nonconductive, and motor M is de-energized. The auto tune assembly will thereafter remain de-energized even if the received television signal which caused it to unlatch is subsequently interrupted or ceases transmission, i.e., the auto tune assembly 19 will not resume its signal seeking operation until push button 21 is again depressed regardless of changes in the signals being received by receiver 10.

Figure 4:
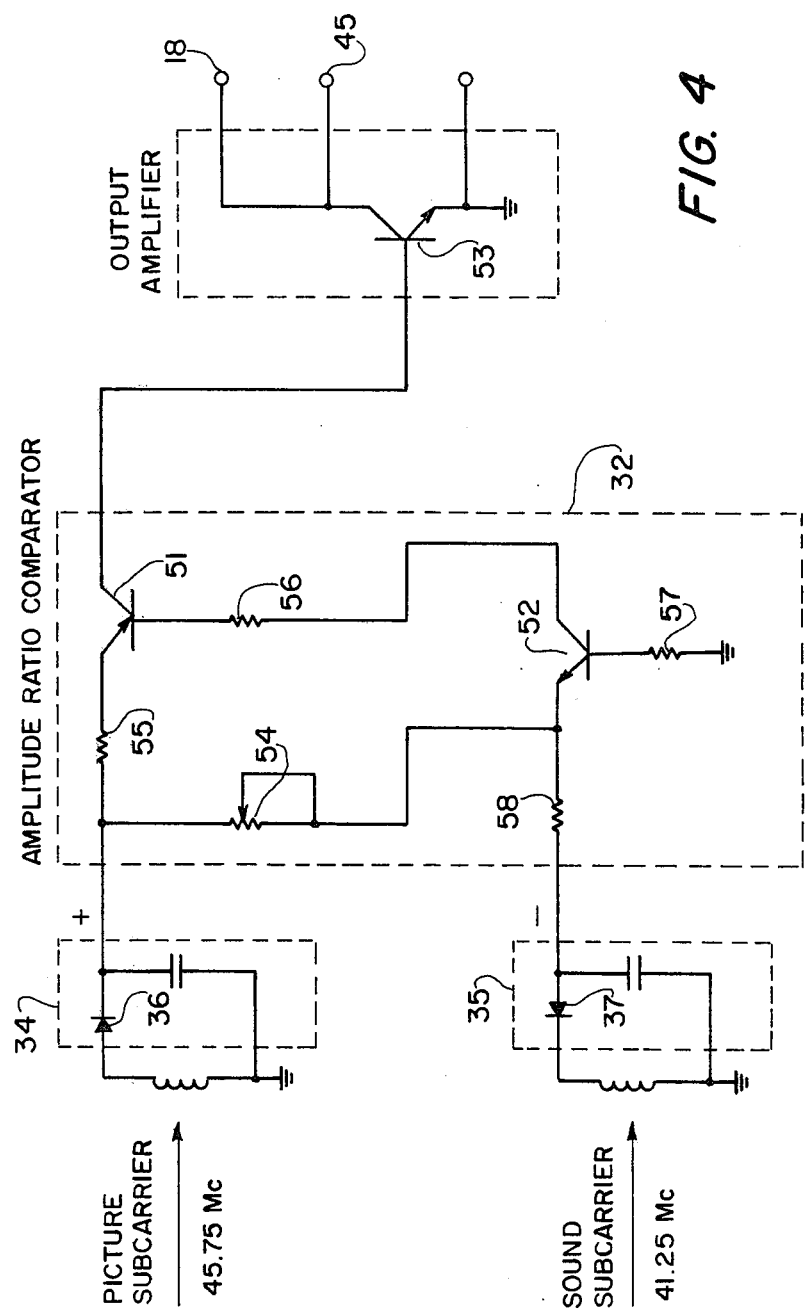
FIG. 4 is a circuit diagram of a second form of ratio comparator and control signal generator which may be employed in the circuit of FIG. 2.

FIG. 4 illustrates an alternative ratio comparator and control signal generator which may be employed in the circuit of FIG. 2 in place of that described previously in reference to FIG. 3. The circuit of FIG. 4 exhibits certain advantages over those of FIG. 3 in that it permits a greater input voltage variation, and is therefore less dependent on the automatic gain control of the receiver for proper operation.

The circuit of FIG. 4 comprises two tuned circuits 34, 35 corresponding to those previously described in reference to FIG. 3, i.e., circuit 34 is tuned to the picture IF subcarrier and includes a detector diode 36, and circuit 35 is tuned to the sound subcarrier and includes an oppositely poled detector diode 37. The picture subcarrier is rectified by diode 36 and is applied via a resistor 55 to the emitter of PNP transistor 51, while the sound subcarrier is rectified by diode 37 and is applied via resistor 58 to NPN transistor 52. The base of transistor 51 is connected via a resistor 56 to the collector of transistor 52, and the base of transistor 52 is in turn connected via a resistor 57 to ground. The output of circuit 34 is also connected, via an adjustable resistor 54, to the junction between resistor 58 and transistor 52. The collector of transistor 51 is connected to an output amplifier 53 which is structurally similar to transistor 43 (FIG. 3), and which is operative to provide a control signal at terminal 45 for the signal seeker as well as a control signal at terminal 18 for control of the muting operation.

The two DC voltages which are applied respectively to transistors 51 and 52 from circuits 34 and 35 are in additive relation through transistors 51 and 52, and the overall functioning of the ratio comparator shown in FIG. 4 is dependent upon the ratio of these two voltages. This will become more readily apparent by consideration of the operation of the circuit under conditions of correct tuning, and also under conditions of incorrect tuning.

Considering first the operation of the circuit when the absolute magnitudes of the voltages, and their ratio, correspond to a point of correct tuning, the operating conditions defined by the circuit of FIG. 4 are as follows:

a. The second IF signal of 41.25 MC, after rectification, must have a magnitude above the minimum conduction threshold of transistor 52. This threshold voltage is about 0.6 volts. Any voltage in excess of this value will render NPN transistor 52 conductive, and the conduction of transistor 52 will then operate to apply a turn-on voltage to the base of transistor 51 via resistor 56;

b. The picture IF signal of 45.75 MC must have a rectified DC voltage magnitude at least one volt higher that that of the sound IF in order to overcome the voltage drop across transistor 52. The voltage at the emitter of transistor 51 is determined in part by the value of resistors 55 and 56.

When the above voltage conditions (a) and (b) both occur, transistors 51 and 52 will both be rendered conductive; and this will in turn supply a DC potential to the base of output amplifier transistor 53 which, in turn, will start to conduct current from point 45 via the signal seeker to ground thereby to stop further tuning of the receiver.

Let us now consider, however, the operation of the FIG. 4 circuit when conditions of correct tuning are not present. As already described, transistor 51 will operate when the rectified sound IF voltage is above about 0.6 volts and the rectified picture IF voltage is about 1.5 volts. However if the rectified picture IF voltage exceeds a certain upper limit (e.g., its magnitude is more than six times that of the rectified sound IF voltage) the current flowing through resistor 54 will shut off transistor 52 by lowering the negative potential obtained via circuit 35 from the sound subcarrier and, as a result, transistor 51 will also be rendered non-conductive thereby preventing conduction of output amplifier transistor 53. If, on the other hand, the rectified sound IF voltage supplied by circuit 35 is greater than the rectified picture IF voltage (as it would be when the signal seeker has tuned to an image frequency) the negative output from transistor 52 will be so high as to shut off transistor 53. In each case of incorrect tuning, therefore, output transistor 53 will be nonconductive and the signal seeker will continue its tuning operation until points of correct tuning, corresponding to aforementioned conditions (a) and (b) are obtained.

While I have thus described preferred embodiments of the present invention, many variations will be apparent to those skilled in the art. Thus, while I have specifically illustrated a signal seeker of the motor type in the drawings, the invention can also be employed as an automatic fine tuning control for varactor tuned tuners for television receivers. Still other variations can be made. It should therefore be understood that the foregoing description is intended to be illustrative only and not limitative of the present invention, and all such variations and modifications as are in accord with the principles described are meant to fall within the scope of the appended claims.

Having thus described my invention, I claim:

1. In an intercarrier television receiver of the type comprising tunable signal translating means responsive to correct reception of a television transmission for producing picture subcarrier and sound subcarrier signals having frequencies spaced from one another by an intercarrier frequency, a signal seeker coupled to said tunable signal translating means for continuously varying the tuning of said receiver over a predetermined television frequency spectrum, and a control circuit for interrupting the tuning operation of said signal seeker at points of correct tuning in said spectrum, the improvement wherein said control circuit comprises first tuned circuit means coupled to said signal translating means and tuned to the frequency of said picture subcarrier for producing a first signal having an amplitude related to the amplitude of said picture subcarrier, second tuned circuit means coupled to said signal translating means and tuned to the frequency of said sound subcarrier for producing a second signal having an amplitude related to the amplitude of said sound subcarrier, and comparator means for monitoring the comparative amplitudes and the amplitude ratio of said first and second signals, said comparator means including signal generating means for producing a control signal operative to interrupt the tuning operation of said signal seeker only when the amplitude of said first signal is higher than the amplitude of said second signal and said first and second signal amplitudes are in a predetermined ratio to one another.

2. The receiver of claim 1 wherein said predetermined ratio is substantially 4:1.

3. The receiver of claim 1 wherein said first tuned circuit means comprises a first channel including first amplifier means therein for coupling said first signal to an input of said comparator means, said second tuned circuit means comprising a second channel including second amplifier means therein for coupling said second signal to an input of said comparator means, and gain control means coupled to each of said amplifier means for equalizing the gain in said first and second channels.

4. The receiver of claim 3 wherein each of said channels includes a pair of tuned circuits coupled to the input and to the output of the amplifier means in said channel, the pair of tuned circuits in said first channel each being tuned to said picture subcarrier frequency, and the pair of tuned circuits in said second channel each being tuned to said sound subcarrier frequency.

5. The receiver of claim 1 wherein said comparator means includes ratio adjustment means for selectively varying the predetermined ratio at which said signal generating means is operative to produce said control signal.

6. The receiver of claim 5 wherein said comparator means comprises a transistor having a first electrode coupled to the output of said first tuned circuit means and a second electrode coupled to the output of said second tuned circuit means, said ratio adjustment means comprising an impedance connected between the outputs of said first and second tuned circuit means and having a variable tapping point thereon which is connected to the third electrode of said transistor.

7. The receiver of claim 6 wherein the outputs of said first and second tuned circuit means are coupled to first and second detectors respectively, said detectors being oppositely poled relative to one another whereby said first and second signals comprise substantially dc potentials exhibiting opposing polarities at said first and second transistor electrodes and at opposite ends of said impedance respectively.

8. The receiver of claim 7 wherein said transistor is normally nonconductive and is rendered conductive only when the potentials coupled to its said electrodes exhibit predetermined minimum and comparative potential levels, said signal generating means comprising a normally nonconductive further transistor having one of its electrodes coupled to the output of said first-mentioned transistor and also coupled to the output of one of said tuned circuit means, conduction of said first-mentioned transistor being operative to couple a signal to said electrode of said further transistor having a polarity opposite to and of different magnitude from that supplied by said one of said tuned circuit means, said further transistor being rendered conductive to provide said control signal only when the potential at its said one electrode, as jointly determined by the state of conductivity of said first-mentioned transistor and the potential level at the output of said one of said tuned circuit means, exhibits a predetermined polarity.

9. The receiver of claim 1 including means for normally disabling the sound and video channels in said television receiver, and means responsive to production of said control signal for controlling said disabling operation.

10. The receiver of claim 1 wherein said signal seeker includes a driving motor, a manually operable start switch, an energizing circuit for said motor including a normally nonconductive drive transistor, and circuit means responsive to momentary actuation of said start switch for rendering said drive transistor conductive thereby to energize said driving motor, said circuit means including means responsive to production of said drive control signal for interrupting conduction of said transistor thereby to de-energize said driving motor.

11. The receiver of claim 10 wherein said driving motor is connected to a source of energization potential via the emitter-collector circuit of said normally nonconductive drive transistor, said circuit means including means for connecting the base of said drive transistor to ground upon momentary closure of said start switch to render said drive transistor conductive thereby to energize said driving motor from said source of energization potential, said circuit means further including a normally nonconductive latch transistor connected between the base of said drive transistor and ground, said latch transistor being rendered conductive by conduction of said drive transistor to maintain said drive transistor in its conductive state after said start switch opens, and means coupling said control signal to said latch transistor whereby production of said control signal operates to interrupt conduction of said latch transistor thereby to terminate conduction of said drive transistor and to de-energize said driving motor.

12. The receiver of claim 1 wherein said comparator means comprises a normally nonconductive first transistor coupled to the output of said first tuned circuit means, a normally nonconductive second transistor coupled to the output of said second tuned circuit means for rendering said second transistor conductive when the output of said second tuned circuit means exceeds a predetermined magnitude, means coupling said second transistor to said first transistor to couple the output voltage of said second tuned circuit means to said first transistor via said second transistor when said second transistor is conductive thereby to render said first transistor conductive when said second transistor is conductive and the output voltage of said first tuned circuit means exceeds the output voltage of said second tuned circuit means by a predetermined minimum value, and a normally nonconductive third transistor coupled to said first transistor for conduction when said first transistor is conductive thereby to produce said control signal.

13. The receiver of claim 12 wherein said comparator means further comprises means for rendering said second transistor nonconductive in response to the condition wherein the ratio between the outputs of said first tuned circuit means and said second tuned circuit means exceeds a predetermined ratio.

14. The receiver of claim 13 wherein said predetermined ratio is substantially six.

15. The receiver of claim 1 wherein said comparator means comprises a first transistor coupled to the output of said first tuned circuit means, a second transistor coupled to the output of said second tuned circuit means, means for interconnecting said first and second transistors to one another to produce an output signal which is responsive to the additive relation of the outputs of said first and second tuned circuit means, and a third transistor the state of conduction of which is responsive to the magnitude and polarity of said output signal for selectively producing said control signal.

* * * * *

UNITED STATES PATENT AND TRADEMARK OFFICE
CERTIFICATE OF CORRECTION

PATENT NO. : 4,047,226
DATED : September 6, 1977
INVENTOR(S) : Rhey Warren Hedges It is certified that error appears in the above-identified patent and that said Letters Patent are hereby corrected as shown below:

In the Specification:

Column 3 line 61 change "6" to -- 16 --

Column 4 line 63 change "wil" to -- will --

Column 6 line 44 change "tune" to -- turn --

Signed and Sealed this

Sixth Day of December 1977

[SEAL]

Attest:

RUTH C. MASON
Attesting Officer

LUTRELLE F. PARKER
Acting Commissioner of Patents and Trademarks